(12) United States Patent
Kirk et al.

(10) Patent No.: US 6,297,647 B2
(45) Date of Patent: Oct. 2, 2001

(54) CROSSTALK TEST UNIT AND METHOD OF CALIBRATION

(75) Inventors: James W Kirk, Westborough; Ron Cook, Littleton; Michael J Haley, Marlborough; Fanny I Mlinarsky, Bolton, all of MA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/740,378

(22) Filed: Dec. 19, 2000

Related U.S. Application Data

(62) Division of application No. 09/357,399, filed on Jul. 20, 1999.

(51) Int. Cl.$^7$ .................................................. G01R 27/28
(52) U.S. Cl. .......................................... 324/628; 324/684
(58) Field of Search .................................. 324/628, 684, 324/669; 702/57, 65, 106, 107; 455/67.4, 67.1

(56) References Cited

U.S. PATENT DOCUMENTS

| | | | |
|---|---|---|---|
| 5,629,628 | * | 5/1997 | Hinds et al. .......................... 324/628 |
| 5,731,706 | * | 3/1998 | Koeman et al. ...................... 324/628 |

* cited by examiner

Primary Examiner—Safet Metjahic
Assistant Examiner—Vincent Q. Nguyen

(57) ABSTRACT

A test unit for measuring crosstalk in twisted pair cable. The test unit has an output signal balance (OSB) circuit that compensates for parasitic capacitance at its output terminals. The OSB circuit has a voltage controlled capacitance connected in circuit with each output terminal to control the effective capacitance between the output terminals and ground. The bias voltage for the variable capacitances is calibrated by a method in which the voltage for one of the variable capacitors is held constant while the voltage for the other capacitor is varied in voltage levels. A test signal frequency sweep is applied to the test unit output terminals. First and second voltage values are obtained and a final bias voltage value is calculated from using these two values.

4 Claims, 4 Drawing Sheets

US 6,297,647 B2

CROSSTALK TEST UNIT AND METHOD OF CALIBRATION

This is a divisional of copending application Ser. No. 09/357,399 filed on Jul. 20, 1999.

FIELD OF THE INVENTION

This invention relates to the measurement of crosstalk in a multi-pair cable. In particular, the invention relates to a test unit with minimized output signal imbalance and common mode susceptibility and to a method for calibrating the test unit.

BACKGROUND OF THE ART

Crosstalk in a multi-pair cable is the unwanted coupling of signals from one wire pair to another. When crosstalk is measured at the same end of the cable where the crosstalk originates, the technique is called near end crosstalk (NEXT) measurement. Twisted pair LAN technologies, such as 10BASE-T, 100BASE-T, and Token Ring are primarily vulnerable to cable crosstalk problems that can be tested by measuring the NEXT of the installed cable.

When crosstalk is measured at the end of the cable opposite from where the crosstalk originates, the technique is called far end crosstalk (FEXT) measurement. FEXT is measured by applying a test signal to a wire pair at a far end of the cable and measuring the disturbance on the other wire pairs in the cable at the other or near end. It is relevant to specify the FEXT performance of cabling for network technologies, such as the new 1000BASE-T specification, that transmit simultaneously on multiple wire pairs in the same direction.

While it is easy to measure the FEXT performance of an installed multi-pair cable, it is difficult to specify certification limits for such measurements since FEXT varies with the cable length. The equal level far end crosstalk (ELFEXT) measurement technique was developed as a practical alternative for field certification. Generally, ELFEST equals FEXT minus attenuation caused by the cable. ELFEXT measurements compensate for the effect of varying cable length so that all installed cable can be certified to the same limit.

Residual crosstalk is any signal that is due to the test instrument itself. Residual crosstalk error must be taken into account in crosstalk measurement analysis.

A test signal is generally applied to a wire pair in a differential mode. That is, the signals on the wires of a wire pair are ideally equal in amplitude and opposite in phase (180° out of phase). These conditions reflect an ideal output signal balance (OSB). A differential receiver, receiving a signal with common mode and differential mode components of the wires, will ideally reject the common mode component and respond only to the differential component. This characteristic reflects an ideal common mode rejection (CMR).

However, these conditions are hard to achieve due to imperfect components used to make the test unit and to asymmetries in layout. For example, the output terminals of a test unit can have unbalanced parasitic capacitances. In the past, such imbalance has been minimized by careful selection of components and layout or placement within the test unit assembly. This selection and placement process has been costly and time consuming.

Accordingly there is a need for a test instrument that minimizes deviation of OSB and CMR from the perfect or ideal conditions of equal amplitude and opposite phase. There is also a need for a method to calibrate such an instrument.

SUMMARY OF THE INVENTION

A test unit for conducting crosstalk measurements of a cable under test according to the present invention has a plurality of pairs of output terminals. Each pair of output terminals has a first terminal and a second terminal that have first and second parasitic capacitances, respectively. A first variable capacitor is coupled to the first terminal to form a first effective capacitance value that includes the first parasitic capacitance. A second variable capacitor is coupled to the second terminal to form a second effective capacitance value that includes the second parasitic capacitance. A controller sets the first and second variable capacitors to a first predetermined value and a second predetermined value, respectively. The first predetermined value and the second predetermined value are selected such that the first effective capacitance value is substantially equal to the second effective capacitance value.

The variable capacitors are preferably varactors that exhibit a variable capacitance that is voltage controlled. The controller sets the first and second predetermined values by controlling a first bias voltage and a second bias voltage applied to the first and second varactors, respectively.

A method according to the present invention calibrates the output signal balance of the test unit by calibrating, the test unit when it is not connected to a cable. First the first bias voltage is set to a predetermined value. The second bias voltage is then sequentially set to n voltage values. A test signal frequency sweep is applied to the first and second output terminals for each of the n voltage values. An OSB response is measured during each test signal frequency sweep. A first voltage value is marked when the OSB response becomes lower than a predetermined limit. A second voltage value is marked when the OSB response subsequently becomes larger than the standard limit. A bias voltage value is then calculated using the first and second voltage values. The bias voltage is then downloaded to the test unit.

BRIEF DESCRIPTION OF THE DRAWINGS

Other and further objects, advantages and features of the present invention will be understood by reference to the following specification in conjunction with the accompanying drawings, in which like reference characters denote like elements of structure and.

DESCRIPTION OF PREFERRED EMBODIMENT

Figure 1:
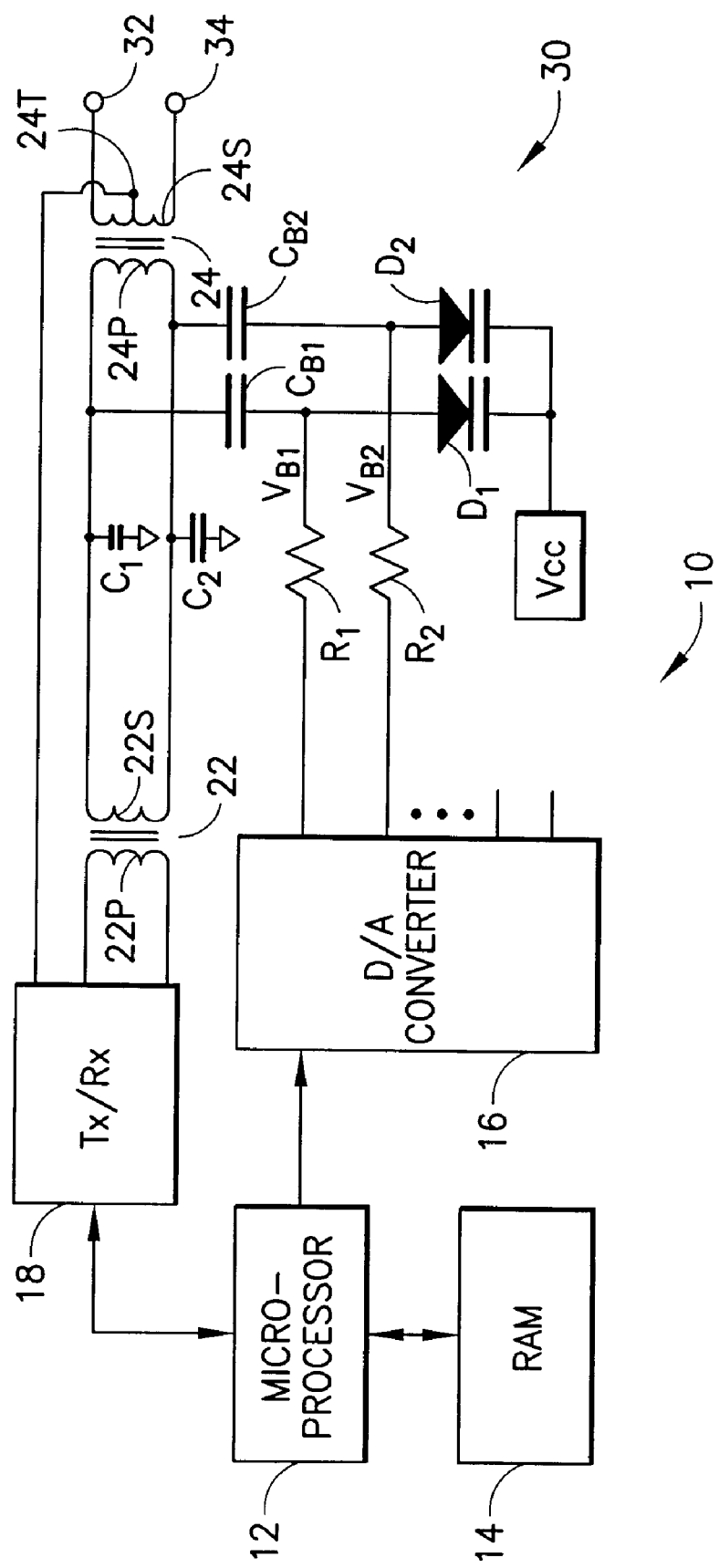
FIG. 1 is a circuit schematic diagram in part and a block diagram in part of a test unit according to the present invention.

With reference to FIG. 1, there is provided a test unit generally represented by numeral 10. Test unit 10 has a microprocessor 12, a random access memory (RAM) 14, a digital to analog (D/A) converter 16, a transmit/receive (Tx/Rx) measurement section 18, a transformer 22, a transformer 24 and an output signal balance circuit 30.

Test unit 10 generally performs crosstalk measurements of a cable (not shown in FIG. 1) by way of a pair of output terminals 32 and 34. The cable is a multi-pair cable that has a plurality of twisted wire pairs. For example, the cable may be of a type that is used in a local area network (LAN) for coupling computer terminals and servers in a network. When connected to test the cable, output terminals 32 and 34 are connected to one of the wire pairs of the cable.

Microprocessor 12 directs measurement procedures by means of operating Tx/Rx measurement section 18 to transmit, receive and process signals via output terminals 32 and 34 to the wire pair under test. The measurement procedures and test parameters are stored in RAM 14 and accessed by microprocessor 12. RAM 14 may include non-volatile memory in whole or in part.

Test signals are translated between output terminals 32 and 34 and Tx/Rx measurement section 18 via transformer 22 and 24. Transformer 22 is connected in series with transformer 24. Transformer 22 has a primary winding 22P connected with Tx/Rx measurement section 18 and a secondary winding connected with a primary winding 24P of transformer 24. Transformer 24 has a secondary winding 24S that is connected to output terminals 32 and 34. These connections permit the translation of test signals in a differential mode via output terminals 32 and 34 with the cable under test.

Secondary winding 24S has a center tap 24T that is connected with Tx/Rx measurement section 18. This connection permits the translation of signals in a common mode via output terminals 32 and 34 with the cable under test. That is, the signals on the wires of a wire pair are ideally equal in amplitude and phase.

Output terminal 32 has a parasitic capacitance $C_1$, shown as a shunt capacitor to circuit ground or other reference. Similarly, output terminal 34 has a parasitic capacitance $C_2$, shown as a shunt capacitor to circuit ground. These parasitic capacitances $C_1$ and $C_2$ are shown as coupled to terminals 32 and 34 by transformer 24. These parasitic capacitances $C_1$ and $C_2$ arise from the components used in test unit 10 as well as their layout in assembly. Parasitic capacitances $C_1$ and $C_2$ are generally unequal in value. This causes a deviation or variance from an ideal OSB and CMR.

In accordance with the present invention, OSB circuit 30 is provided to minimize any such deviation. OSB circuit 30 includes a first active device $D_1$ connected in parallel with parasitic capacitance $C_1$ and a second active device $D_2$ connected in parallel with parasitic capacitance $C_2$. Active devices $D_1$ and $D_2$ have a capacitance that varies with an applied voltage. Active devices $D_1$ and $D_2$ may suitably be varactors that under normal operating conditions are in a reverse bias condition. Active devices $D_1$ and $D_2$ have their cathodes connected to a d. c. voltage source VCC. Active device $D_1$ has its anode connected via a resistor $R_1$ to D/A converter 16 and active device $D_2$ has its anode connected via a resistor $R_2$ to D/A converter 16.

A d. c. blocking capacitor $C_{B1}$ is connected in series with active device $D_1$. A d. c. blocking capacitor $C_{B2}$ is connected in series with active device $D_2$.

Microprocessor 12 causes D/A converter 16 to apply predetermined bias voltages $VB_1$ and $VB_2$ to the anodes of active devices $D_1$ and $D_2$, respectively. The values of $VB_1$ and $VB_2$ are selected to operate active devices $D_1$ and $D_2$ in a reverse bias condition and to yield a first effective capacitance between output terminal 32 and ground and a second effective capacitance between output terminal 34 and ground, the first and second effective capacitances being substantially equal. Microprocessor 12 accomplishes this by means of $VB_1$ and $VB_2$ parameters or values that are stored in RAM 14 and used to generate the $VB_1$ and $VB_2$ voltages.

Varactors $D_1$ and $D_2$ are preferably packaged in the same semiconductor assembly to achieve nearly identical varactors as well as common temperature compensation. For example, varactors $D_1$ and $D_2$ may suitably be M/A-COM part number MA4ST083CK.

Though OSB circuit 30 is shown as connected to the primary winding 24P of transformer 24, it could just as well be connected directly to terminals 32 and 34 or to the primary winding 22P of transformer 22.

Though test unit 10 is shown in FIG. 1 with a single pair of output terminals, test unit 10 may have a plurality of pairs of output terminals with each having a separate OSB circuit. For example test unit 10 may have four pairs of output terminals for testing of a conventional cable that has four twisted wire pairs. D/A converter 16 is shown in FIG. 1 to have additional pairs of output leads for the additional OSB circuits.

Figure 2:
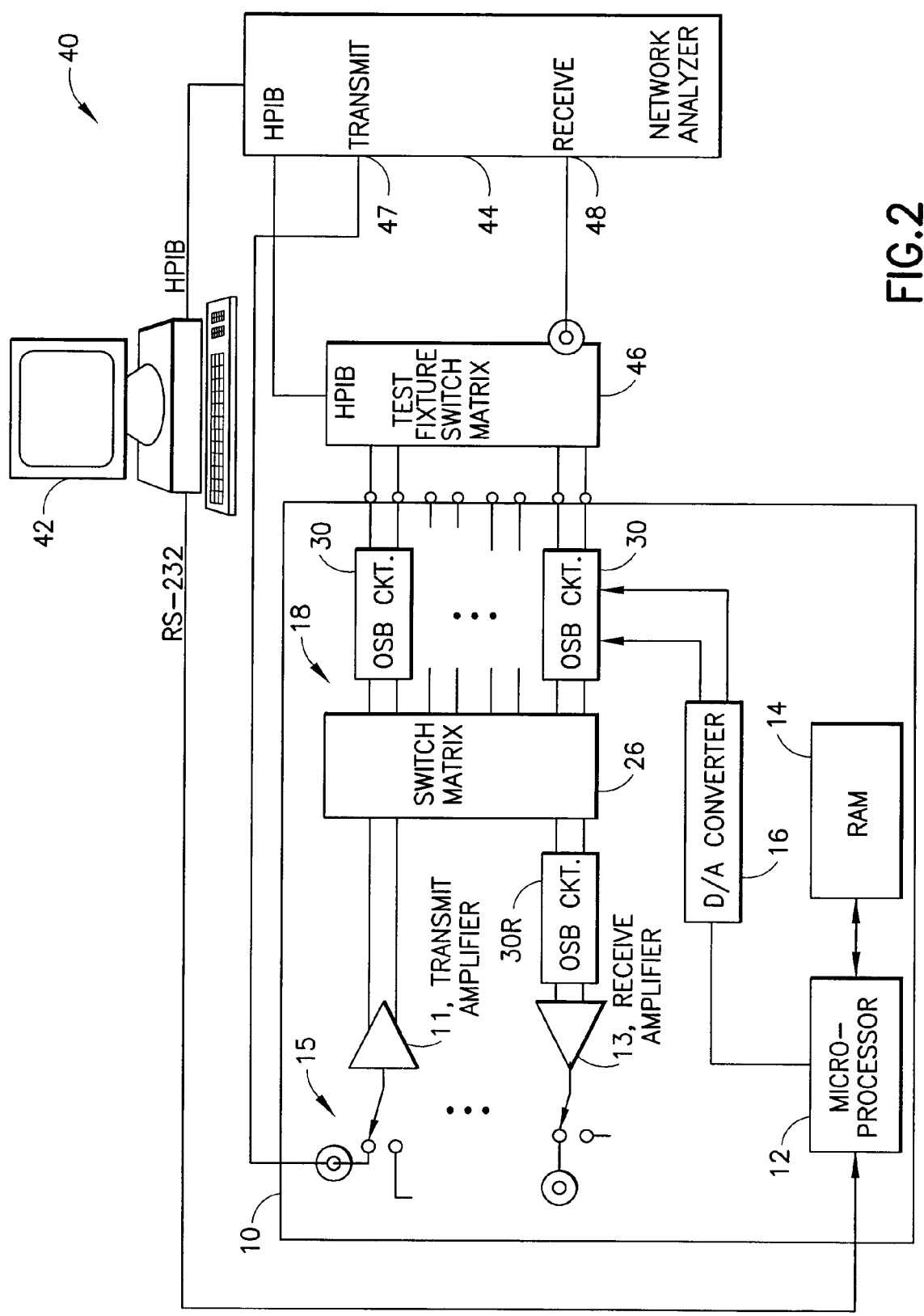
FIG. 2 is a block diagram of a calibration system for calibrating the FIG. 1 test unit.

Referring to FIG. 2, there is shown a system 40 for the calibration of test unit 10 to set the $VB_1$ and $VB_2$ parameters for the frequency range of interest. Calibration system 40 includes a computer 42, a network analyzer 44 and a switch matrix 46. Computer 42 is connected with network analyzer via a standard test bus HPIB and to test unit 10 via a standard serial interface RS-232. Computer 42 may suitably be a personal computer that has a memory in which is stored calibration procedures for controlling network analyzer 44 and test unit 10.

Tx/Rx measurement section 18 of test unit 10 includes a transmit amplifier 11, a receive amplifier 13, a calibration mode switch 15, and a switch matrix 26. Transformers, such as 22 and 24 of FIG. 1 are not shown in FIG. 2 to avoid clutter. Calibration switch 15 is shown in the calibration position in FIG. 2 to allow test signals to be injected into amplifier 11 by network analyzer 44 or taken from receive amplifier 13 by network analyzer 44. Test unit 10 also includes a separate OSB circuit 30 for each of four pairs of output terminals.

Network analyzer 44 is conventional. It has a transmit terminal 47 that is connected to transmit amplifier 11 for the purpose of injecting a test signal into test unit 10. The injected test signal is applied via switch matrix 26 to a selected one of OSB circuits 20 as directed by microprocessor 12 under the control of computer 42. Network analyzer has a receive terminal 48 that receives the injected test signal from the selected OSB circuit 20 via test switch matrix 46.

Figures 3, 4:
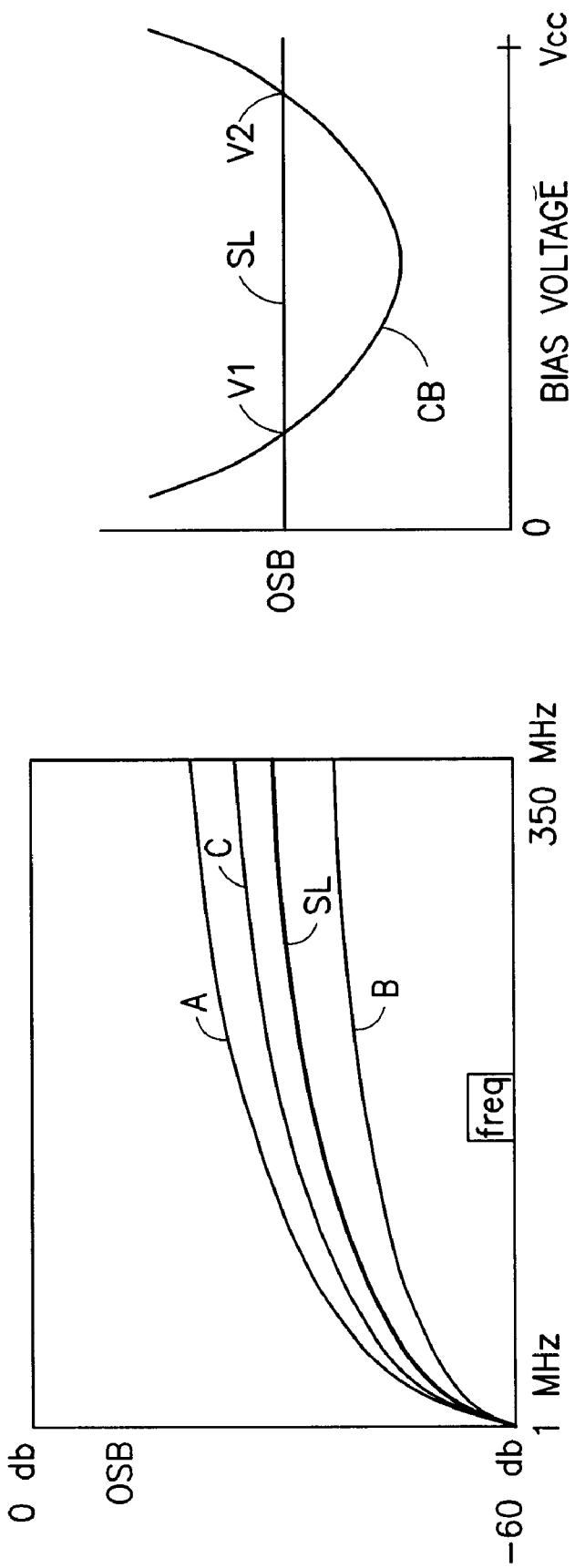
FIG. 3 is a graph of OSB versus frequency for optimized bias voltage values.
FIG. 4 is a graph of OSB versus bias voltage.

Referring to FIG. 3, a set of curves A, B, C and SL illustrate that OSB by nature deteriorates as signal frequency increases. Curve SL is a standard limit, such as Telecommunications Industry Association level III OSB limit.

The calibration process involves injecting a test signal frequency sweep into transmit amplifier 11 for each of n step values of one of the bias voltages to find the bias voltage value that most nearly reflects the standard limit over the frequency range of interest.

Referring to FIG. 4, the standard limit at a particular frequency is shown as an OSB level SL. A curve CB represents for test unit 10 the values of OSB at this particular frequency as a function of bias voltage, and shows how the OSB varies above and below the standard limit.

According to the calibration method of the present invention, one of the bias voltages is set to a mediate value in its range and the other bias voltage is varied in steps over its range. A frequency sweep test signal is applied via transmit amplifier 11 by network analyzer 44 for each step level. For example, $VB_1$ is set to a mediate value of say 2.5 volts for a range of 5 volts.

Bias voltage $VB_2$ is then sequentially set to n step values. For each step value, network analyzer 44 injects a frequency sweep signal via transmit amplifier 11, receives the signal at receive terminal 48 and measures the OSB response with reference to the standard limit OSB value. The frequency sweep signal varies in frequency across the range of interest. With reference to FIG. 4, a first voltage value V1 is marked when the OSB response first falls below the standard limit. A second voltage value V2 is marked when the OSB response rises above the standard limit. The desired value of $VB_2$ is calculated using the V1 and V2 values. For example, $VB_2$ is simply the midpoint between V1 and V2.

Figure 5:
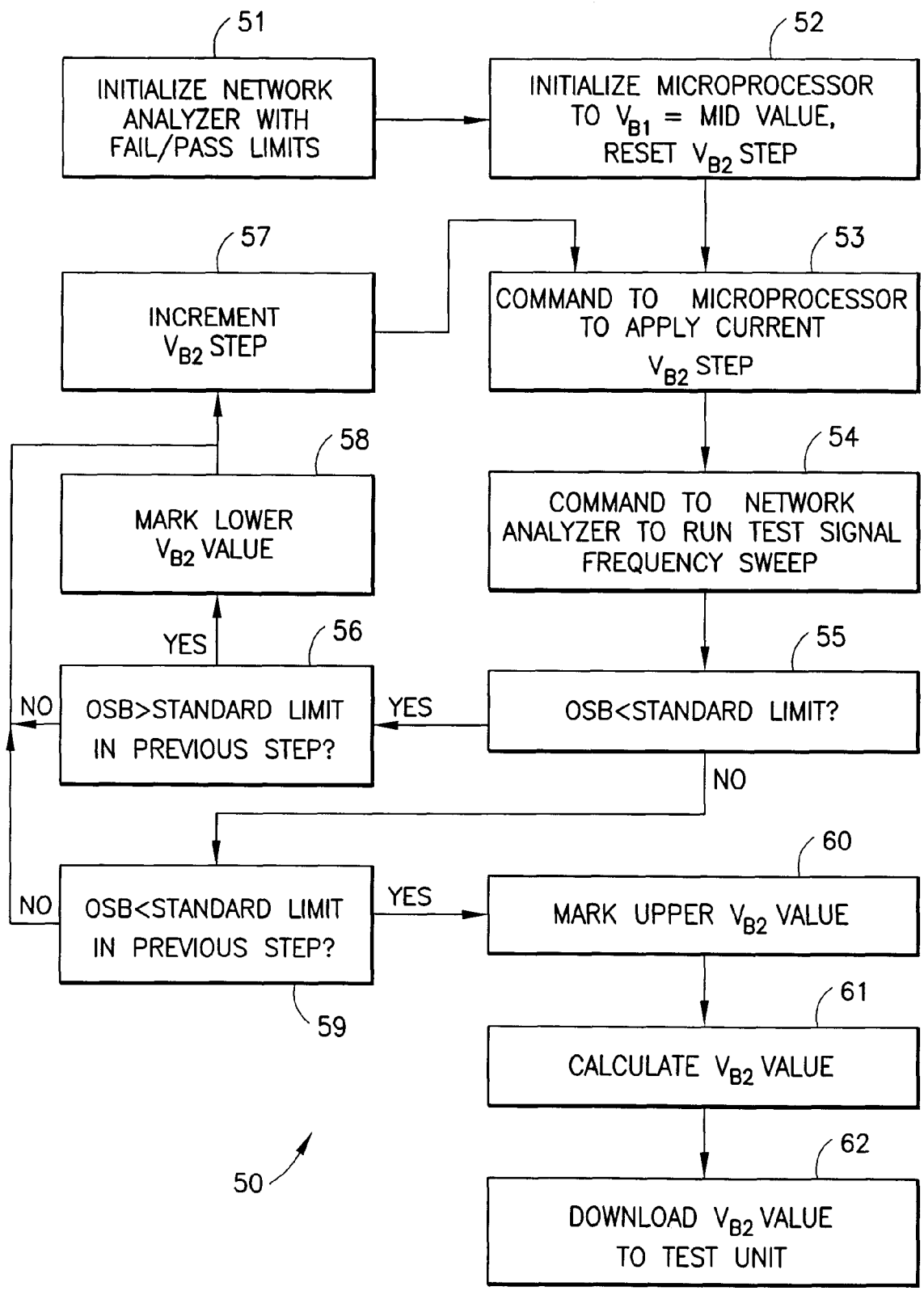
FIG. 5 is flow diagram of a calibration procedure performed by the computer and network analyzer of FIG. 2 for the test unit according to the invention.

Referring to FIG. 5, there is shown a flow diagram of a calibration procedure 50 that is used by computer 42 to control microprocessor 12 and network analyzer 44 when calibrating test unit 10. Calibration procedure 50 begins at a step 51 with the initialization of network analyzer 44 with the fail/pass standard limit. At a step 52, microprocessor 12 is initialized to a $VB_1$ value mediate of its range. Also, $VB_2$ is reset to an initial step value.

Computer 42 at a step 53 issues a command to microprocessor 12 to apply the current $VB_2$ step level of bias voltage to OSB circuit 30. At a step 54, computer 42 issues a command to network analyzer 44 to run a test signal frequency sweep. Computer 42 then at a step 55 determines if the OSB is less than the standard limit. If not, computer 42 next determines at a step 59 if the OSB was less than the standard limit during the previous step level. If not, the $VB_2$ step level is incremented to the next step level. The process described by steps 53, 54, 55, 59 and 57 reiterates until step 55 determines that the OSB is less than the standard limit.

When step 55 determines that the OSB is less than the standard limit, computer 42 next determines at a step 56 if in the previous step level, the OSB was greater than the standard limit. If not, the $VB_2$ voltage level is incremented to the next voltage level at a step 57. If the OSB was greater than the standard limit in the previous step, the current bias voltage level is marked as a V1 value that corresponds to the value V1 in FIG. 4. The $VB_2$ voltage level is then incremented at step 57.

The process defined by steps 53 through 57 then reiterates until step 55 determines that the OSB is once again is not less than the standard limit. When this happens, computer 42 then determines if the OSB was less than the standard limit for the previous bias voltage level. If so the current bias voltage level is marked at a step 60 as a V2 value that corresponds to the V2 value of FIG. 4. Next, computer 42 calculates the $VB_2$ value at a step 61. For example, the $VB_2$ value can be calculated as a value midway between the V1 and V2 values. The calculated $VB_2$ value is then downloaded to microprocessor 12 at a step 62.

Referring again to FIG. 3, an OSB circuit 30R is coupled to the differential leads from switch matrix 26 to receive amplifier 30 to compensate for any OSB or CMR imbalance on these leads. OSB circuit 30 R is identical to OSB circuits 30. A calibration procedure substantially similar to the one shown in FIG. 5 is used to calibrate OSB circuit 30R, except that network analyzer 44 has its transmit terminal connected to test fixture switch matrix 46 and its receive terminal connected to the output of receive amplifier 13.

It will be apparent to those of skill in the art that the active balancing technique can be applied on any differential signal for OSB and/or CMR.

The present invention having been thus described with particular reference to the preferred forms thereof, it will be obvious that various changes and modifications may be made therein without departing from the spirit and scope of the present invention as defined in the appended claims.

What is claimed is:

1. A test unit for conducting crosstalk measurements of a cable under test, said test unit comprising:

a plurality of pairs of output terminals, each pair of output terminals having a first terminal with a first parasitic capacitance and a second terminal with a second parasitic capacitance;

a first variable capacitor connected in circuit with said first terminal to form a first effective capacitance value including said first parasitic capacitance;

a second variable capacitor connected in circuit with said second terminal to form a second effective capacitance value including said second parasitic capacitance; and a controller for setting said first variable capacitor to a first predetermined value and said second variable capacitor to a second predetermined value, said first predetermined value and said second predetermined value being selected such that said first effective capacitance value is substantially equal to said second effective capacitance value, whereby the effect of unequal values of said first and second parasitic capacitances on an output signal balance of said first and second terminals is minimized.

2. The test unit of claim 1, wherein said first variable capacitor is a first varactor and said second variable capacitor is a second varactor, and wherein said controller sets said first and second predetermined values by controlling a first bias voltage and a second bias voltage applied to said first and second varactors, respectively.

3. The test unit of claim 2, wherein said first varactor is coupled in parallel with said first parasitic capacitance and said second varactor is coupled in parallel with said second parasitic capacitance.

4. The test unit of claim 3, wherein said first and second varactors are always reverse biased when a crosstalk measurement is performed.

* * * * *